US012315445B2

(12) United States Patent
Cho et al.

(10) Patent No.: US 12,315,445 B2
(45) Date of Patent: May 27, 2025

(54) DISPLAY DEVICE INCLUDING A SIGNAL LINE CONNECTED TO DRIVING CIRCUITS OF DIFFERENT COLUMNS

(71) Applicant: Samsung Display Co., Ltd., Yongin-Si (KR)

(72) Inventors: Jae Hyung Cho, Yongin-si (KR); Min Kyu Woo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/401,711

(22) Filed: Jan. 2, 2024

(65) Prior Publication Data

US 2024/0290263 A1  Aug. 29, 2024

(30) Foreign Application Priority Data

Feb. 27, 2023  (KR) .................. 10-2023-0025739

(51) Int. Cl.
*G09G 3/3233* (2016.01)
*H10K 59/131* (2023.01)

(52) U.S. Cl.
CPC ......... *G09G 3/3233* (2013.01); *H10K 59/131* (2023.02); *G09G 2300/0819* (2013.01); *G09G 2300/0842* (2013.01); *G09G 2310/0281* (2013.01); *G09G 2310/08* (2013.01); *G09G 2320/02* (2013.01)

(58) Field of Classification Search
CPC ......... G09G 3/3233; G09G 2300/0819; G09G 2300/0842; G09G 2310/0281; G09G 2310/08; G09G 2320/02; H10K 59/131
See application file for complete search history.

(56) References Cited

U.S. PATENT DOCUMENTS

| | | | |
|---|---|---|---|
| 11,521,555 | B2 | 12/2022 | Choi |
| 2009/0262051 | A1* | 10/2009 | Kim ................. G11C 19/28 345/80 |
| 2016/0042691 | A1* | 2/2016 | Na .................. G11C 19/28 345/82 |
| 2022/0208113 | A1* | 6/2022 | Choi ................ G09G 3/3291 |
| 2023/0045292 | A1* | 2/2023 | Cheng .............. H10K 59/1216 |

FOREIGN PATENT DOCUMENTS

| | | |
|---|---|---|
| KR | 10-0741977 B1 | 7/2007 |
| KR | 10-2020-0032586 A | 3/2020 |
| KR | 10-2021-0079586 A | 6/2021 |
| KR | 10-2022-0096831 A | 7/2022 |

* cited by examiner

*Primary Examiner* — Afroza Chowdhury
(74) *Attorney, Agent, or Firm* — Innovation Counsel LLP

(57) ABSTRACT

A display device includes: a display area including a plurality of pixels; a peripheral area including a plurality of driving circuits that are disposed in a plurality of columns, the driving circuits driving the pixels; a plurality of pads including a first pad disposed in a pad area that receive a signal; and a first signal line that extends from the peripheral area in a column direction and is connected to the first pad of the pad area, wherein the first signal line includes a plurality of branches extending from the first signal line and connected to driving circuits of different columns.

19 Claims, 10 Drawing Sheets

DISPLAY DEVICE INCLUDING A SIGNAL LINE CONNECTED TO DRIVING CIRCUITS OF DIFFERENT COLUMNS

CROSS-REFERENCE TO RELATED APPLICATION

This application claims priority to and the benefit of Korean Patent Application No. 10-2023-0025739 filed in the Korean Intellectual Property Office on Feb. 27, 2023, the entire content of which is incorporated herein by reference.

BACKGROUND OF THE INVENTION (a) Field of the Invention

The present disclosure relates to a display device.

(b) Description of the Related Art

Display devices that display images are used in various electronic devices such as computers and smartphones, and people are increasingly reliant on display devices everyday. In addition, the resolution is becoming higher to meet the demands of users who want high-quality images.

As the resolution of the display device increases, the number of pixels increases, the number of driving circuits increases, and accordingly, the number of signal lines used in the driving circuits also increases. As the number of signal lines increases, more area is occupied by the signal lines and the number of pads to which external inputs are applied for the signal lines may increase. Sometimes, more device real estate being taken up by signal lines and pads results in less area being available to be used for displaying an image. Moreover, more signal lines may undesirably increase power consumption.

SUMMARY OF THE INVENTION

The present disclosure improves display quality by reducing the area occupied by a signal line.

An embodiment provides a display device including: a display area including a plurality of pixels; a peripheral area including a plurality of driving circuits that are arranged in a plurality of columns, the driving circuits driving the pixels; a plurality of pads including a first pad disposed in a pad area, the plurality of pads receiving signals; and a first signal line that extends in a column direction in the peripheral area and is connected to the first pad of the pad area, wherein the first signal line includes a plurality of branches extending from the first signal line and connected to driving circuits of different columns.

The first signal line may transmit a clock signal.

The plurality of pads further include a second pad.

The display device may further include a second signal line that extends parallel to the first signal line in the peripheral area and is connected to the second pad, the second signal line may include a plurality of branches extending from the second signal line and connected to driving circuits of different columns, and the first and second signal lines may transmit a pair of clock signals.

The plurality of driving circuits may be arranged in a first column, a second column, and a third column, the plurality of pads may further include a third pad and a fourth pad, the display device may further include a third signal line that extends in the column direction in the peripheral area and is connected to the third pad and a fourth signal line that extends in the column direction in the peripheral area and is connected to the fourth pad, the first and second signal lines may be adjacent to the first column and include a plurality of branches that are respectively connected to driving circuits of the first column and the second column, and the third and fourth signal lines may be adjacent to the third column and include a plurality of branches that are respectively connected to a driving circuit of the third column, and transmit the pair of clock signals.

The driving circuits of different columns may output different output signals.

The display device may further include a plurality of third signal lines that extend in the column direction and are adjacent to the driving circuits of preselected columns and supply driving control signals controlling the driving circuits of the preselected columns, and the plurality of pads may further include a plurality of third pads connected to the plurality of third signal lines.

The plurality of driving circuits may include a plurality of first driving circuits arranged in a first column and a second column, the plurality of first driving circuits may output first output waveforms that are time-delayed from each other, and the first and second signal lines may include a plurality of branches respectively connected to driving circuits of the first and second columns.

The plurality of driving circuits may include a plurality of second driving circuits arranged in a third column and a fourth column, the plurality of second driving circuits may output second output waveforms that are different from the first output waveforms and are time-delayed from each other, and the first and second signal lines may include a plurality of branches respectively connected to driving circuits of the third and fourth columns.

The plurality of pads may further include a third pad and a fourth pad, the display device may further include a third signal line that extends in the column direction in the peripheral area and is connected to the third pad and a fourth signal line that extends in the column direction in the peripheral area and is connected to the fourth pad, the third and fourth signal lines may include a plurality of branches respectively connected to driving circuits of different columns connected to branches of the first and second signal lines, and the third and fourth signal lines may transmit a pair of clock signals different from a pair of clock signals transmitted by the first and second signal lines.

The plurality of pads may further include a third pad, a fourth pad, a fifth pad, and a sixth pad, the display device may further include a third signal line that extends in the column direction in the peripheral area and is connected to the third pad, a fourth signal line that extends in the column direction in the peripheral area and is connected to the fourth pad, a fifth signal line that extends in the column direction in the peripheral area and is connected to the fifth pad, and a sixth signal line that extends in the column direction in the peripheral area and is connected to the sixth pad, the third and fourth signal lines may include a plurality of branches respectively connected to driving circuits of at least one column, the fifth and sixth signal lines may include a plurality of branches respectively connected to driving circuits of at least one column that are not connected to branches of the third and fourth signal lines, the third and fourth signal lines may transmit a pair of clock signals different from a pair of clock signals transmitted by the first and second signal lines, and the fifth and sixth signal lines may transmit the pair of clock signals that are transmitted by the third and fourth signal lines.

Another embodiment provides a display device including: a display area including a plurality of pixels; a peripheral area including a plurality of driving circuits that drive the pixels and are arranged in first, second, and third columns; a plurality of pads including a first pad and a second pad disposed in a pad area, the plurality of pads receiving signals; a first signal line that extends in a column direction in the peripheral area and is connected to the first pad of the pad area; and a second signal line that extends in a column direction in the peripheral area and is connected to the second pad of the pad area, wherein the driving circuits of the first, second, and third columns output different output signals, the first and second signal lines transmit a pair of clock signals, and the first and second signal lines are adjacent to the first column and include a plurality of branches extending from the first and second signal lines and connect to the driving circuits of the first and second columns.

The first and second signal lines may include a plurality of branches connected to the driving circuit of the third column.

The plurality of pads may further include a third pad and a fourth pad, the display device may further include a third signal line that extends in the column direction in the peripheral area and is connected to the third pad and a fourth signal line that extends in the column direction in the peripheral area and is connected to the fourth pad, and the third and fourth signal lines may be adjacent to the third column and include a plurality of branches that are connected to a driving circuit of the third column, and may transmit the pair of clock signals.

The first and second signal lines may include branches that are located outside an area in which the plurality of driving circuits are arranged, the branches being connected to the driving circuit of the second column.

The branches connecting the first and second signal lines to the driving circuit of the second column may pass through a first column area where the driving circuits of the first column are arranged.

The plurality of pads may further include a third pad and a fourth pad, the display device may further include a third signal line that extends in the column direction in the peripheral area and is connected to the third pad and a fourth signal line that extends in the column direction in the peripheral area and is connected to the fourth pad, the third and fourth signal lines may include a plurality of branches respectively connected to the driving circuits of the first and second columns, and the third and fourth signal lines may transmit a pair of clock signals different from a pair of clock signals transmitted by the first and second signal lines.

The display device may further include a third signal line that extends in the column direction and is adjacent to the driving circuit of the first column and supplies a first driving control signal that controls the driving circuit of the first column, a fourth signal line that extends in the column direction and is adjacent to the driving circuit of the second column and supplies a second driving control signal that controls the driving circuit of the second column, and a fifth signal line that extends in the column direction and is adjacent to the driving circuit of the third column and supplies a third driving control signal that controls the driving circuit of the third column, and the plurality of pads may further include a third pad connected to the third signal line, a fourth pad connected to the fourth signal line, and a fifth pad connected to the fifth signal line.

The driving circuit of the first column may output a signal that causes the pixel to emit light according to the first driving control signal, the driving circuit of the second column may output a signal that initializes the pixel according to the second driving control signal, and the driving circuit of the third column may output a signal that performs compensation of a transistor of the pixel according to the third driving control signal.

Each pixel may perform the initialization, the transistor compensation, and the light emitting in sequence.

The operation of each pixel may be determined according to voltage levels of output signals of the driving circuits of the first to third columns.

As described above, according to the embodiment of the present disclosure, an area occupied by a signal line and a pad may be reduced by sharing a signal line of a signal commonly used by driving circuits disposed in different columns.

DETAILED DESCRIPTION OF THE EMBODIMENTS

Figure 1:
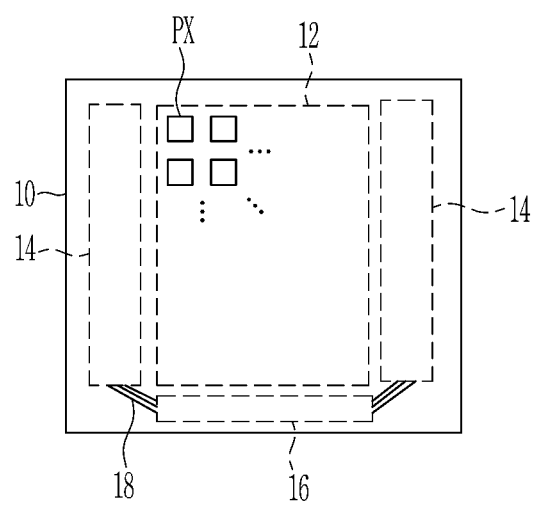
FIG. 1 is a layout view of a display device according to an embodiment of the present disclosure.

The present disclosure will be described more fully hereinafter with reference to the accompanying drawings, in which embodiments of the disclosure are shown. As those skilled in the art would realize, the described embodiments may be modified in various different ways, all without departing from the spirit or scope of the present disclosure.

In order to clearly describe the present disclosure, parts or portions that are irrelevant to the description are omitted, and identical or similar constituent elements throughout the specification are denoted by the same reference numerals.

In addition, since the size and thickness of each part or portion shown in the drawings are arbitrarily set for convenience of description, the present disclosure is not limited thereto. In particular, in the drawings, the thickness is enlarged and exaggerated in order to clearly express various layers and regions or areas and facilitate explanation.

It will be understood that when an element such as a layer, film, region, area, or substrate is referred to as being "on" or "above" another element, it can be directly on the other element or intervening elements may also be present. In contrast, when an element is referred to as being "directly on" another element, there are no intervening elements present. Further, in the specification, the word "on" or "above" means disposed on or below the object portion, and does not necessarily mean disposed on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

Hereinafter, a display device according to an embodiment of the present disclosure will be described in detail with reference to FIG. 1 to FIG. 4.

Figure 2:
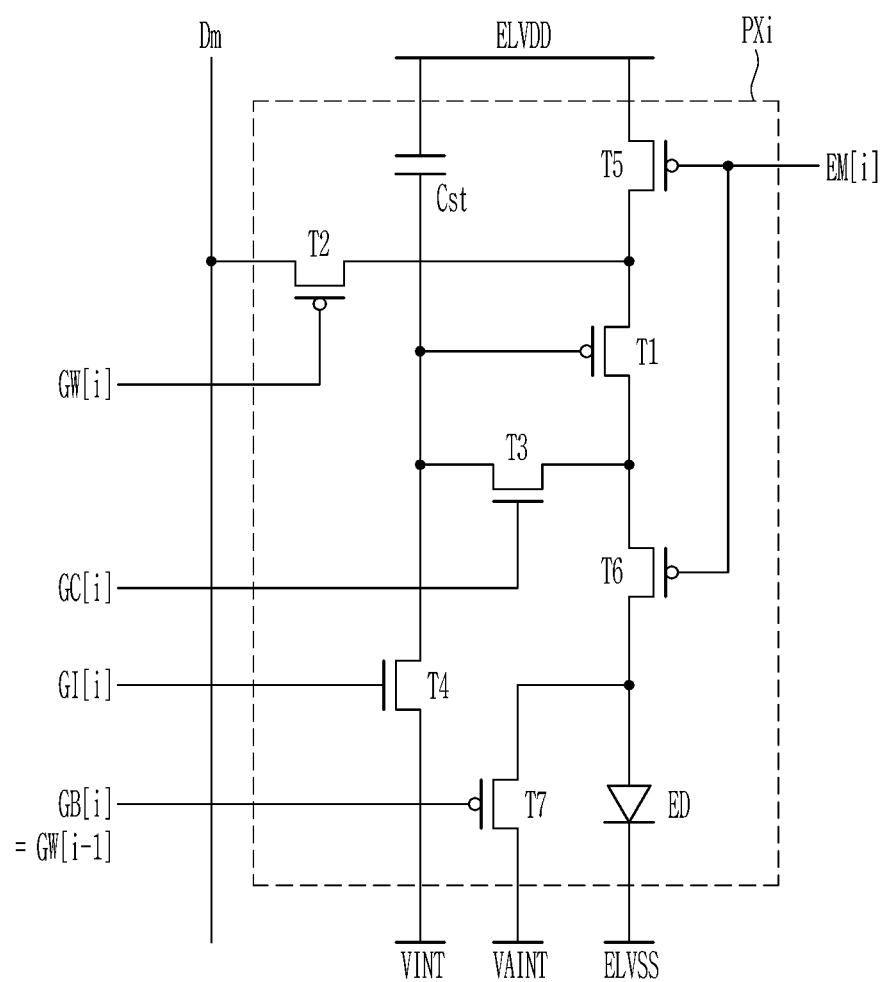
FIG. 2 is a pixel circuit diagram of a display device according to an embodiment of the present disclosure.
Figure 3:
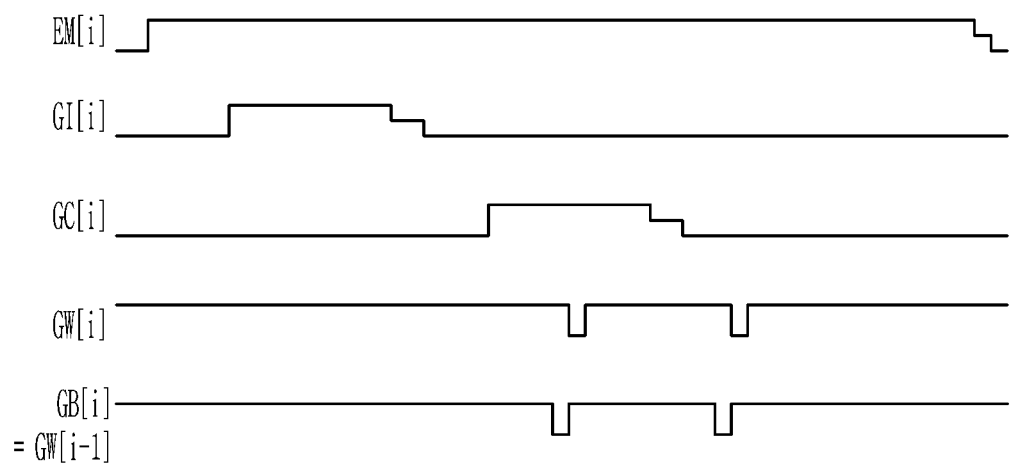
FIG. 3 is a waveform diagram of a signal applied to a pixel in a display device according to an embodiment of the present disclosure.
Figure 4:
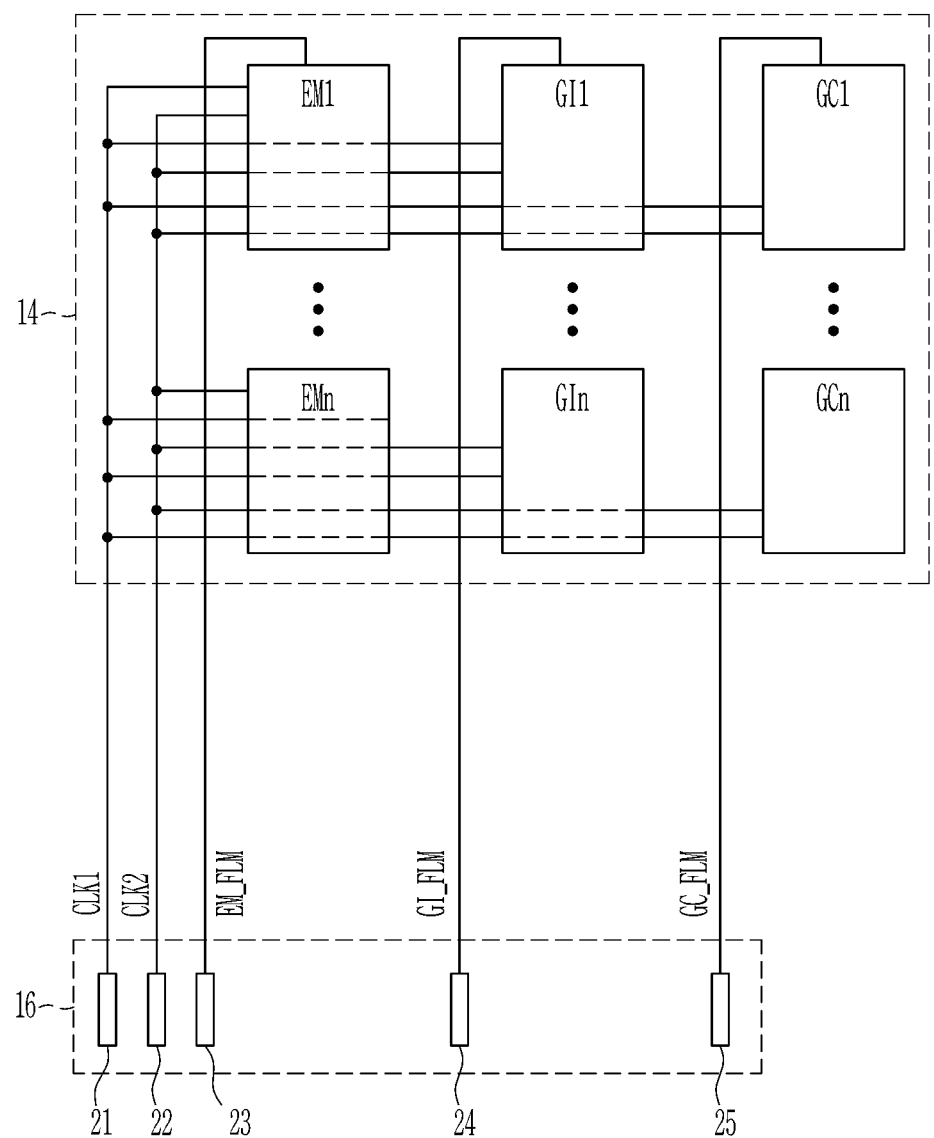
FIG. 4 schematically shows a peripheral area and a pad area of the display device shown in FIG. 1.

FIG. 1 is a layout view of a display device according to an embodiment of the present disclosure, FIG. 2 is a pixel circuit diagram of a display device according to an embodiment of the present disclosure, FIG. 3 is a waveform diagram of a signal applied to a pixel of an i-th row in a display device according to an embodiment of the present disclosure, and FIG. 4 schematically shows a peripheral area and a pad area of the display device shown in FIG. 1.

Referring to FIG. 1, a display device 10 according to the present embodiment may be, for example, a flat panel display device, and may include an organic light emitting display device or a liquid crystal display device, but is not limited thereto. The display device 10 may have a quadrangular shape as a panel shape, but is not limited thereto.

The display device 10 includes a display area 12 including a plurality of pixels PX displaying an image, one or more peripheral areas 14 including a plurality of driving circuits for driving the pixels PX, and one or more pad areas 16 including a plurality of pads for electrical connection between the driving circuit and the outside. A driving circuit of the peripheral area 14 and a pad of pad area 16 are connected through a signal line 18.

In the figures, it is shown that the display area 12 is disposed in the center of a substrate, two peripheral areas 14 are disposed at the left and right sides of the display area 12, respectively, and the pad area 16 is disposed lower to the display area 12, but their arrangements are not limited thereto. For example, the display device 10 may include only one peripheral area 14 disposed at one side of the display area 12, and the pad area 16 may be disposed along a different side of the display area 12 than what is depicted in FIG. 1. In addition, the display device 10 may include two pad areas 16 disposed at two sides of the display area 12 instead of one single pad area 16. In this case, the two pad areas 16 and the two peripheral areas 14 may be disposed to face each other or to be adjacent to each other.

When the peripheral areas 14 are disposed at both sides, both peripheral areas 14 may include different types of driving circuits. For example, one peripheral area 14 may include light emitting driving circuits, and the other peripheral area 14 may include gate driving circuits.

The pixels PX of the display area 12 may be arranged in a matrix configuration, and light emitted from the pixels PX may collectively display an image. Although the matrix arrangement of the pixels PX is provided as an example, this is not a limitation of the disclosure and the pixels PX may be arranged in a staggered manner, or may be arranged in various forms as needed.

According to the embodiment of the present disclosure, referring to FIG. 2, each pixel, for example, a pixel PXi (for convenience of description, a subscript m indicating a column is omitted) in an i-th row and an m-th column may include a plurality of transistors T1, T2, T3, T4, T5, T6, and T7, a capacitor Cst, and at least one light emitting diode ED.

The plurality of transistors T1, T2, T3, T4, T5, T6, and T7 may include a first transistor T1, a second transistor T2, a third transistor T3, a fourth transistor T4, a fifth transistor T5, a sixth transistor T6, and a seventh transistor T7. The third and fourth transistors T3 and T4 are turned on when a high voltage is applied to their gates and turned off when a low voltage is applied to their gates, and conversely, the remaining transistors, that is, the first, second, fifth, sixth, and seventh transistors T1, T2, T5, T6, and T7 are turned on when a low voltage is applied to their gates and turn off when a high voltage is applied to their gates.

A gate of the first transistor T1 is connected to one terminal of the capacitor Cst, a first terminal thereof, which is one of a source and a drain, is connected to a driving voltage ELVDD via the fifth transistor T5, and a second terminal thereof, which is the other of the source and the drain, is connected to an anode of the light emitting diode ED via the sixth transistor T6. The first transistor T1 may receive a data signal Dm from the second transistor T2 to supply a driving current to the light emitting diode ED.

A gate of the second transistor T2 receives an i-th scanning signal GW[i], a first terminal thereof receives the data signal Dm, and a second terminal is connected to the first terminal of the first transistor T1 and is connected to the driving voltage ELVDD via the fifth transistor T5. The second transistor T2 may be turned on according to the i-th scanning signal GW[i] to transmit the data signal Dm to the first terminal of the first transistor T1.

A gate of the third transistor T3 receives an i-th compensation signal GC[i], and a first terminal thereof is connected to the second terminal of the first transistor T1 and is connected to the anode of the light emitting diode ED via the sixth transistor T6. A second terminal of the third transistor T3 is connected to a second terminal of the fourth transistor T4, one terminal of the capacitor Cst, and the gate of the first transistor T1. The third transistor T3 is turned on according to the i-th compensation signal GC[i] to connect the gate and the second terminal of the first transistor T1 to each other so that the first transistor T1 may be diode-connected.

A gate of the fourth transistor T4 receives an i-th initialization signal GI[i], a first terminal thereof is connected to a first initialization voltage VINT, and the second terminal is connected to one terminal of the capacitor Cst and the gate of the first transistor T1 through the second terminal of the third transistor T3. The fourth transistor T4 is turned on according to the i-th initialization signal GI[i] to transmit the first initialization voltage VINT to the gate of the first transistor T1, thereby performing an initialization operation to initialize the gate voltage of the first transistor T1.

A gate of the fifth transistor T5 receives an i-th light emitting signal EM[i], a first terminal thereof is connected to the driving voltage ELVDD, and a second terminal thereof is connected to the first terminal of the first transistor T1 and the second terminal of the second transistor T2.

A gate of the sixth transistor T6 receives the i-th light emitting signal EM[i], a first terminal thereof is connected to the second terminal of the first transistor T1 and the first terminal of the third transistor T3, and a second terminal is connected to the anode of the light emitting diode ED.

The fifth transistor T5 and the sixth transistor T6 are simultaneously turned on according to the i-th light emitting signal EM[i]. In this case, when the first transistor T1 is diode-connected, the driving voltage ELVDD may be compensated through the first transistor T1, and the compensated voltage may be transmitted to the light emitting diode ED.

A gate of the seventh transistor T7 receives an (i−1)-th scanning signal GW[i−1], a first terminal thereof is connected to the second terminal of the sixth transistor T6 and the anode of the light emitting diode ED, and a second terminal of the seventh transistor T7 is connected to the second initialization voltage VINT and the first terminal of the fourth transistor T4.

As described above, one terminal of the capacitor Cst is connected to the gate of the first transistor T1, and the other terminal thereof is connected to the driving voltage ELVDD. A cathode of the light emitting diode ED may be connected to a common voltage ELVSS.

The structure of the pixel PXi according to the embodiments of the present disclosure is not limited to the structure shown in FIG. 1. For example, the number of transistors and capacitors included in one pixel PXi and their connection relationship may be variously changed.

An operation of the pixel PXi shown in FIG. 2 will be described in detail with reference to FIG. 3.

In an initialization period, when the i-th initialization signal GI[i] becomes a high voltage, the fourth transistor T4 is turned on to transmit the first initialization voltage Vint to the gate of the first transistor T1, and thus the first transistor T1 is turned off. During this period, since the i-th compensation signal GC[i] is at a low voltage, the third transistor T3 is turned off, and since the i-th light emitting signal EM[i], the i-th scanning signal GW[i], and the (i−1)-th scanning signal GW[i−1] are at a high voltage, the second, fifth, sixth, and seventh transistors T2, T5, T6, and T7 are turned off. Accordingly, a difference voltage between the driving voltage ELVDD and the first initialization voltage VINT is stored in the capacitor Cst, and even if the i-th initialization signal GI[i] is turned off again, the gate voltage of the first transistor T1 may be maintained as it is.

In a compensation period, when the i-th compensation signal GC[i] becomes a high voltage, the third transistor T3 is turned on. Accordingly, the voltage at the second terminal of the first transistor T1 becomes the same as the voltage at the gate thereof, so that the voltage difference between the first terminal and the second terminal becomes equal to the threshold voltage of the first transistor T1.

In this state, when the (i−1)-th scanning signal GW[i−1] becomes a low voltage, the seventh transistor T7 is turned on, and accordingly, a second initialization voltage VAINT is applied to the anode of the light emitting diode ED. and a portion of the driving current may be drained through the seventh transistor T7 as a bypass current. When the (i−1)th scanning signal GW[i−1] becomes a high voltage again, the seventh transistor T7 is turned off and the supply of the second initialization voltage VAINT is stopped.

When the i-th scanning signal GW[i] becomes a low voltage, the second transistor T2 is turned on, and thus the data signal Dm is applied to the first terminal of the first transistor T1. Then, the voltage at the second terminal of the first transistor T1 becomes a compensation voltage reduced by the threshold voltage of the first transistor T1 from the data signal Dm. This compensation voltage is also applied to the capacitor Cst, and accordingly, a voltage corresponding to a difference between the driving voltage ELVDD and the compensating voltage may be stored in the capacitor Cst. When the i-th scanning signal GW[i] becomes a high voltage again, the second transistor T2 is turned off and the supply of the data signal Dm is stopped.

When the i-th compensation signal GC[i] becomes low again, the diode-connection state of the first transistor T1 is released.

In a light-emitting period, when the light emitting signal EM[i] becomes a low voltage, the fifth transistor T5 and the sixth transistor T6 are turned on, and a driving current is generated according to a voltage difference between the gate voltage of the first transistor T1 and the driving voltage ELVDD, and the driving current is supplied to the light emitting diode ED through the sixth transistor T6.

The various signals described above, for example, the light emitting signal EM[i], the initialization signal GI[i], the compensation signal GC[i], and the scanning signal GW[i−1], may be respectively generated by a light emitting driving circuit, an initialization driving circuit, a compensation driving circuit, and a gate driving circuit.

Referring to FIG. 4, a plurality of driving circuits (EM1, . . . , EMn, GI1, . . . , GIn, GC1, . . . , GCn) are disposed in the peripheral area 14, and each of the driving circuits (EM1, . . . , EMn, GI1, . . . , GIn, GC1, . . . , GCn) may be connected to the pixels PX of the display area 12. The driving circuits (EM1, . . . , EMn, GI1, . . . , GIn, GC1, . . . , GCn) may be arranged in a matrix form, and each row may correspond one-to-one to a row of the pixels PX arranged in the matrix form. The same type of driving circuits (EM1, . . . , EMn, or GI1, . . . , GIn, or GC1, . . . , GCn), that is, the driving circuits having the same output waveform, except for time delay, may be disposed in the same column, and different types of driving circuits (EM1, . . . , EMn, GI1, . . . , GIn, GC1, . . . , GCn), that is, the driving circuits with different waveforms may be disposed in different columns. However, as described above, the arrangement of the pixel PX may be various, and the arrangement of the driving circuits (EM1, . . . , EMn, GI1, . . . , GIn, GC1, . . . , GCn) may be changed accordingly. Here, for convenience, this disclosure pertains to the case in which the pixels PX and the driving circuits (EM1, . . . , EMn, GI1, . . . , GIn, GC1, . . . , GCn) are arranged in a matrix form.

The driving circuits (EM1, . . . , EMn, GI1, . . . , GIn, GC1, . . . , GCn) are connected to the pixels PX of the display area 12 and supply signals to the pixels PX. The signals supplied to the pixels PX may vary according to the driving scheme of the pixels PX, and accordingly, the type and number of the driving circuits (EM1, . . . , EMn, GI1, . . . , GIn, GC1, . . . , GCn) may vary.

The number of light emitting driving circuits (EM1, . . . , EMn) may be the same as the number of rows of the pixels PX, and may be arranged in a column. The number of a plurality of initialization driving circuits (GI1, . . . , GIn) may be the same as the number of rows of the pixels PX and may be arranged in a column, and the number of a plurality of compensation driving circuits (GC1, . . . , GCn) may also be the same as the number of rows of the pixel PX rows and may be arranged in a column.

In FIG. 4, the light emitting driving circuits (EM1, . . . , EMn), the initialization driving circuits (GI1, . . . , GIn), and the compensation driving circuits (GC1, . . . , GCn) are sequentially arranged in the row direction, but the order thereof may be changed.

When there is not enough space in which a type of driving circuits, for example, the light emitting driving circuits (EM1, . . . , EMn) may be arranged in a column due to the high resolution of the display device 10, they may be arranged in two columns or more. This is the same for the initialization driving circuits (GI1, . . . , GIn) and the compensation driving circuits (GC1, . . . , GCn).

For example, the driving circuits (EM1, . . . , EMS, GI1, . . . , GCn) may be supplied with a pair of clock signals for timing, for example, a first clock signal CLK1 and a second clock signal CLK2, and a driving control signal (EM_FLM, CI_FML, GC_FML) for controlling the outputs of the driving circuits. In detail, a pair of clock signals CLK1 and CLK2 and a light emitting driving control signal EM_FLM may be supplied to the light emission driving circuits (EM1, . . . , EMn), a pair of clock signals CLK1 and CLK2 and an initialization driving control signal GI_FLM may be supplied to the initialization driving circuits (GI1, . . . , GIn), and a pair of clock signals CLK1 and CLK2 and a compensation driving control signal GI_FLM may be supplied to the compensation driving circuits (GC1, . . . , GCn). That is, each type of driving circuits (EM1, . . . , Mn, GI1, . . . , GIn, GC1, . . . , GCn) may be supplied with the same clock signals CLK1 and CLK2 regardless of the type of the driving circuits and a unique driving control signal (EM_FLM, CI_FML, GC_FML).

Each of the signals (CLK1, CLK2, EM_FLM, CI_FML, GC_FML) may be transmitted through a signal line located in the peripheral area 14 and may be supplied from the outside. In FIG. 4, the solid lines adjacent to the signal characteristics (CLK1, CLK2, EM_FLM, CI_FML, GC_FML) indicate signal lines, and for convenience, the same reference characters as those of the signals are used for the signal lines.

Each of the signal lines CLK1, CLK2, EM_FLM, CI_FML, and GC_FML disposed in the peripheral area 14 may extend in a column direction and extend into the pad area 16 to be connected to pads 21, 22, 23, 24, and 25 provided in the pad area 16, and may supplied with signals from the outside through the pads 21, 22, 23, 24, and 25.

For example, the first clock signal line CLK1 may be connected to the pad 21 to receive the first clock signal CLK1 from the outside, and the second clock signal line CLK2 may be connected to the pad 22 to receive the second clock signal CLK2 from the outside. The light emitting driving control signal line EM_FLM may be connected to the pad 23, the initialization driving control signal line GI_FLM may be connected to the pad 24, and the compensation driving control signal line GI_FLM may be connected to the pad 25, respectively, thereby receiving corresponding signals from the outside.

The first and second clock signal lines CLK1 and CLK2 may be adjacent to the light emitting driving circuits (EM1, . . . , EMn), the light emitting driving control signal line EM_FLM may be adjacent to the light emitting driving circuits (EM1, . . . , EMn), the initialization driving control signal line GI_FLM may be adjacent to the initialization driving circuits (GI1, . . . , GIn), and the compensation driving control signal line GI_FLM may be adjacent to the compensation driving circuits (GC1, . . . , GCn).

According to an embodiment of the present disclosure, the same type of driving circuits (EM1, . . . , EMn, or GI1, . . . , GIn, or GC1, . . . , GCn) and/or different types of driving circuits (EM1, . . . , EMn, GI1, . . . , GIn, GC1, . . . , GCn) may share a signal line for a commonly used signal, for example, the signal line CLK1 or CLK2 for a clock signal.

For example, as shown in FIG. 4, the clock signal lines CLK1 and CLK2 may be disposed at the left side of the plurality of light emitting driving circuits (EM1, . . . , EMn) disposed in the leftmost column, and may branch to supply the clock signals to each of the light emitting driving circuits (EM1, . . . , EMn). Each of the clock signal lines CLK1 and CLK2 may also branch to supply the clock signal to the plurality of initialization driving circuits (GI1, . . . , GIn) disposed at the right side of the light emitting driving circuits (EM1, . . . , EM). Each of the clock signal lines CLK1 and CLK2 may also branch to supply the clock signal to the plurality of compensation driving circuits (GC1, . . . , GCn) disposed at the rightmost side.

Referring to FIG. 4, the clock signal lines CLK1 and CLK2 may branch, for the initialization driving circuits (GI1, . . . , GIn) and the compensation driving circuits (GC1, . . . , GCn) that are spaced apart from the clock signal lines CLK1 and CLK2 with the light emitting driving circuits (EM1, . . . , EMn) interposed therebetween, at the level of the corresponding driving circuits (EM1, . . . , EMn, GI1, . . . , GIn, GC1, . . . , GCn) such that the branches pass through an area occupied by the light emitting driving circuit (EM1, . . . , EMn) [and an area occupied by the initialization driving circuits (GI1, . . . , GIn)]. However, the present disclosure is not limited thereto, and may have various branch dispositions.

As described above, according to the embodiment of the present disclosure, the branching of the signal line CLK1 or CLK2 connected to one input pad 21 or 22 may enable to supply a signal for the driving circuits (EM1, . . . , EMn, GI1, . . . , GIn, GC1, . . . , GCn) disposed in different columns, for example, different types of the driving circuits (EM1, . . . , EMn, GI1, . . . , GIn, GC1, . . . , GCn). By doing this, compared with the case of separately supplying signals for the driving circuits (EM1, . . . , EMn, GI1, . . . , GIn, GC1, . . . , GCn) disposed in different columns by providing respective signal lines connected to their own input pads, it is possible to reduce the area occupied by pads and signal lines.

These spirits and purposes of the present disclosure are not limited to the embodiments described above. Signals may be supplied by various different methods for various different signals, which will be described in detail with reference to FIGS. 5 to 10.

FIG. 5 to FIG. 10 illustrate examples of the arrangements of signal lines for a driving circuit according to various embodiments of the present disclosure.

According to the embodiments of the present disclosure, the branching of the clock signal lines CLK1 and CLK2 may be performed at various positions.

Figure 5:
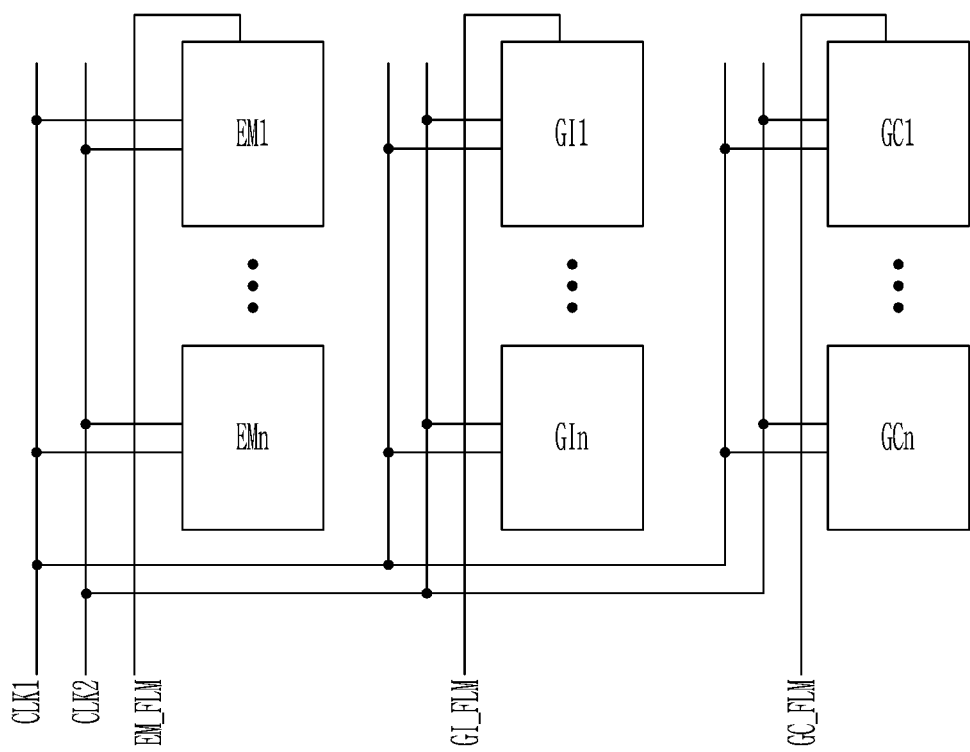
FIG. 5 to FIG. 10 illustrate examples of the arrangements of signal lines for a driving circuit according to various embodiments of the present disclosure.

Referring to FIG. 5, the clock signal lines CLK1 and CLK2 may branch before the position where the columns of the driving circuits (EM1, . . . , EMn, GI1, . . . , GIn, GC1, . . . , GCn) start, for the initialization driving circuits (GI1, . . . , GIn) and the compensation drive circuits (GC1, . . . , GCn) spaced apart from the clock signal lines CLK1 and CLK2 with the light emitting driving circuits (EM1, . . . , EMn) therebetween. In this way, the branches of the clock signal lines CLK1 and CLK2 may be connected to the corresponding driving circuits (EM1, . . . , EMn, GI1, . . . , GIn, GC1, . . . , GCn) without passing through the area occupied by the other driving circuits (EM1, . . . , EMn, GI1, . . . , GIn, GC1, . . . , GCn).

According to the embodiment of the present disclosure, some of the driving circuits (EM1, . . . , EMn, GI1, . . . , GIn, GC1, . . . , GCn) share the clock signal lines CLK1 and CLK2, but others may have separate signal lines without sharing the clock signal lines CLK1 and CLK2.

Figure 6:
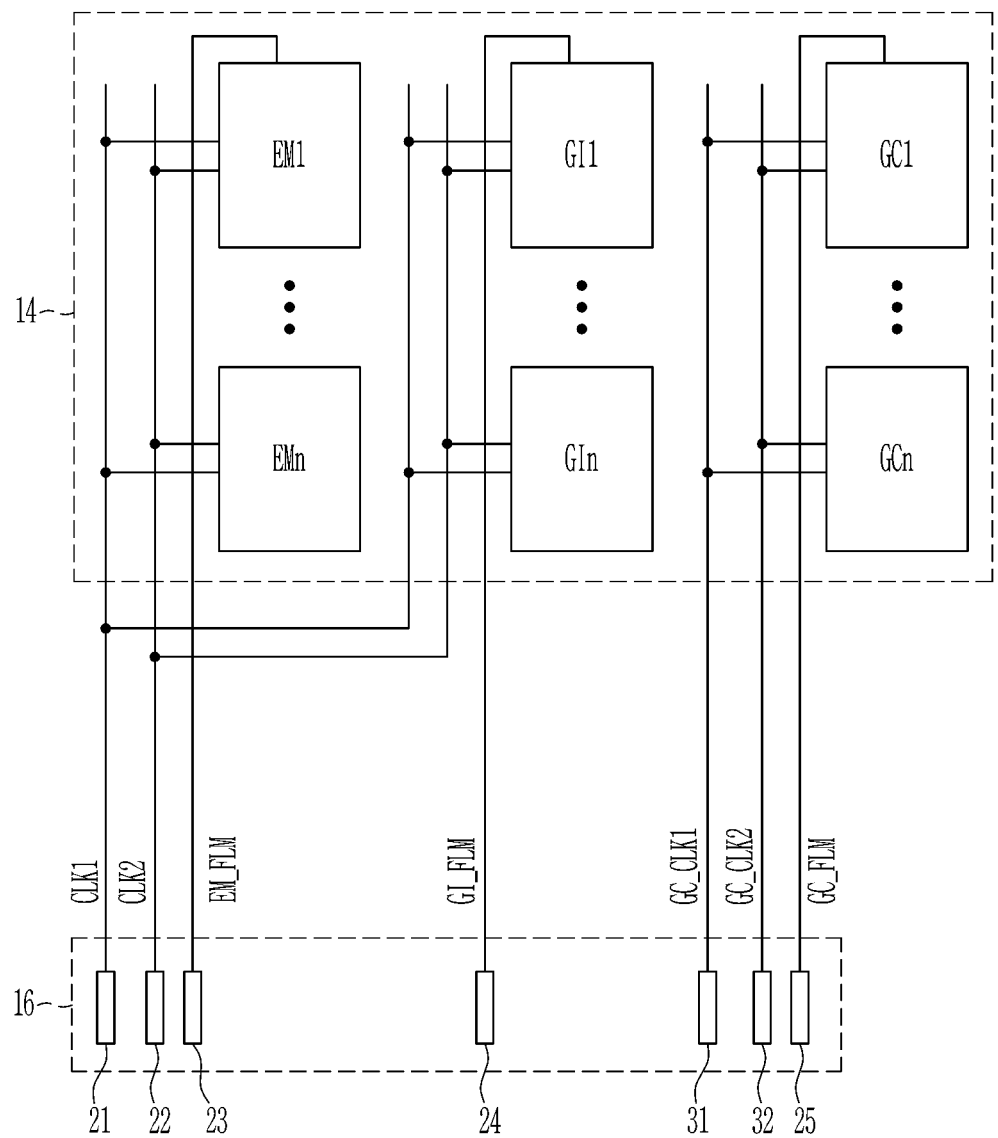

Referring to FIG. 6, the light emitting driving circuits (EM1, . . . , EMn) and the initialization driving circuits (GI1, . . . , GIn) adjacent thereto share the clock signal lines CLK1 and CLK2, while the compensation driving circuits (GC1, . . . , GCn) that are spaced apart from the light emitting driving circuits (EM1, . . . , EMn) receive clock signals through separate clock signal lines GC_CLK1 and GC_CLK2. A pair of clock signal lines GC_CLK1 and GC_CLK2 for the compensation driving circuits (GC1, . . . , GCn) may be connected to pads 31 and 32 of the pad area 16, respectively.

When the separate clock signal lines GC_CLK1 and GC_CLK2 are provided as described above, an area occupied by the clock signal lines GC_CLK1 and GC_CLK2 and the pads 31 and 32 connected thereto may be added. However, those skilled in the art will recognize that this arrangement may be selected for design reasons such as space utilization.

According to the embodiments of the present disclosure, the driving circuits of the same type may be arranged in two or more columns instead of in one column.

Figure 7:
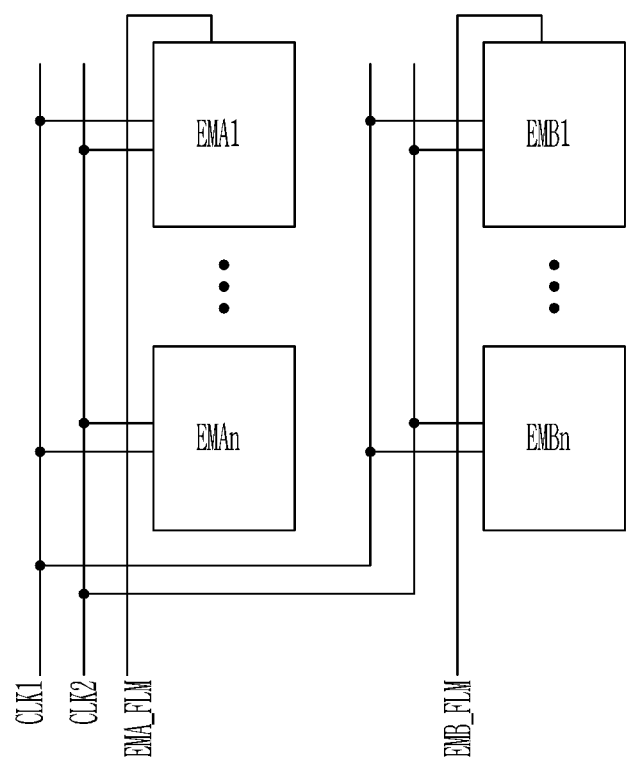

Referring to FIG. 7, for example, a plurality of light emitting driving circuits (EMA1, . . . , EMAn, EMB1, . . . , EMBn) may be arranged in two columns instead of one column as in the examples of FIG. 5 and FIG. 6. In this case, the two columns of light emitting driving circuits (EMA1, . . . , EMAn, EMB1, . . . , EMBn) may also share the clock signal lines CLK1 and CLK2. In the figures, the two columns of light emitting driving circuits (EMA1, . . . , EMAn, EMB1, . . . , EMBn) are shown to receive control signals through separate light emitting driving control signal lines EMA_FLM and EMB_FLM, but they may share one light emitting driving control signal line. In the figures, for convenience, other driving circuits such as the initialization driving circuits (GI1, . . . , GIn) and the compensation driving circuits (GC1, . . . , GCn) are not shown.

Figure 8:
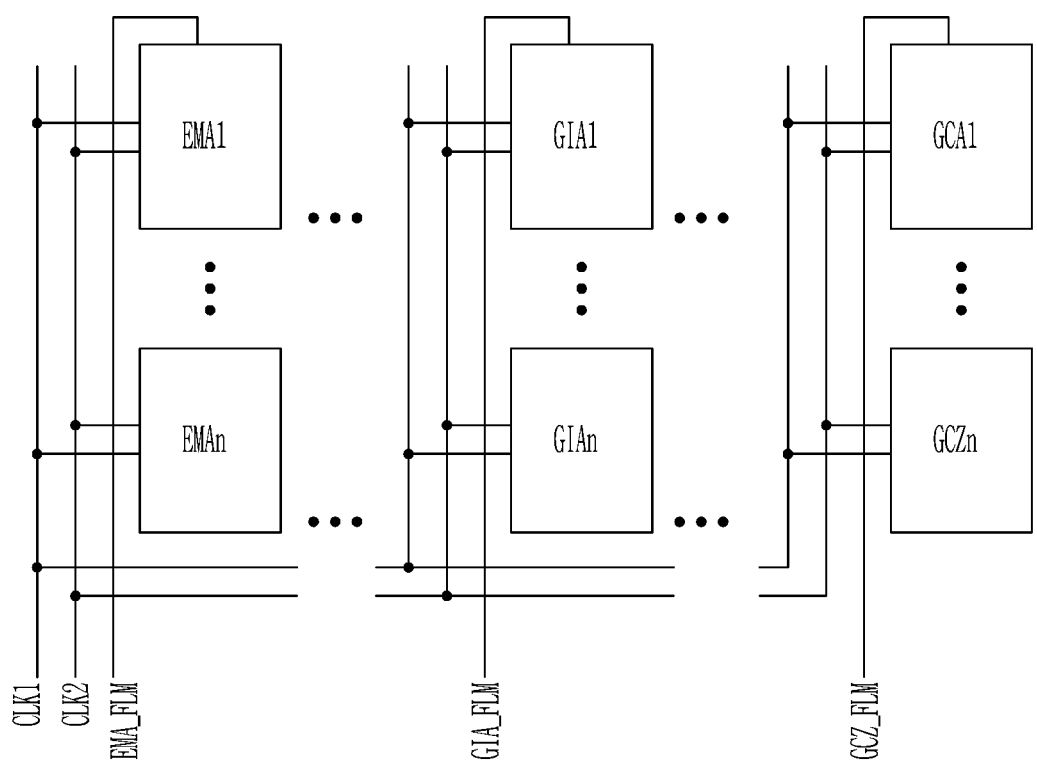

Referring to FIG. 8, for example, each type of driving circuits (EMA1, . . . , GIA1, . . . , GCZn) may be arranged in a plurality of columns, and in this case, the driving circuits (EMA1, . . . , GIA1, . . . , GCZn) in all columns may share the clock signal lines CLK1 and CLK2. However, the embodiment of the present disclosure is not limited thereto, and various arrangements are possible. For example, the columns of the driving circuits are grouped and the driving circuits in each group share the clock signal lines, or all but some columns share clock signal lines while the some have their own clock signals.

In the figures, it is shown that the driving circuits (EMA1, . . . , GIA1, . . . , GCZn) of respective columns receive the control signals through the separate light emitting driving control signal lines (EMA_FLM, . . . , GIA_Fml, . . . , GCZ_FLM), but the embodiments of the present disclosure are not limited thereto.

According to the embodiment, there may be two or more pairs of clock signals supplied to the driving circuits (EM1, . . . , EMn, GI1, . . . , GIn, GC1, . . . , GCn). In this case, the driving circuits (EM1, . . . , EMn, GI1, . . . , GIn, GC1, . . . , GCn) of respective columns may share all or only some of the clock signal lines.

Figure 9:
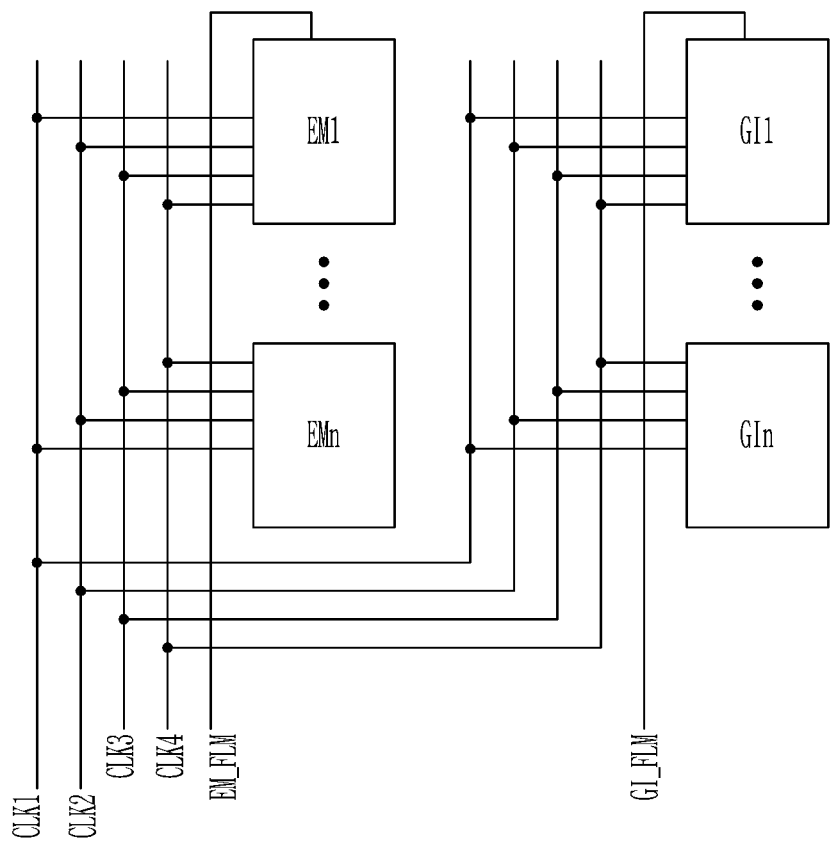
Figure 10:
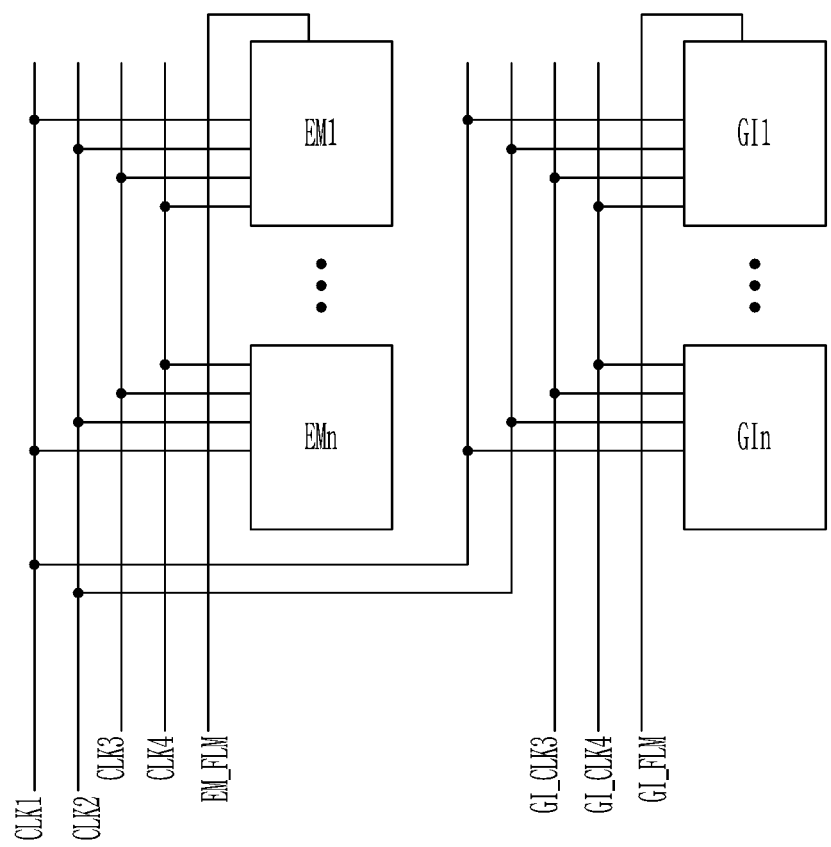

Referring to FIG. 9 and FIG. 10, there are two pairs of clock signals supplied to each of the driving circuits (EM1, . . . , EMn, GI1, . . . , GIn, GC1, . . . , GCn), and accordingly, two pairs of clock signal lines CLK1, CLK2, CLK3, and CLK4 respectively connected to separate pads, that is, four pads, may be provided. In the figures, for convenience, the compensation driving circuits (GC1, . . . , GCn) are omitted.

Referring to FIG. 9, each of the driving circuits (EM1, . . . , EMn, GI1, . . . , GIn, GC1, . . . , GCn) may share both pairs of clock signal lines CLK1, CLK2, CLK3, and CLK4.

Referring to FIG. 10, both columns of the driving circuits (EM1, . . . , EMn, GI1, . . . , GIn, GC1, . . . , GCn) share a pair of clock signal lines CLK1 and CLK2, but may not share the other pair of clock signal lines CLK3 and CLK4 by providing additional pair of clock signal lines GI_CLK3 and GI_CLK4 for the second column.

As described above, the area occupied by the signal line and the pad may be reduced by sharing the signal line of the signal commonly used by the driving circuits disposed in different columns.

While the embodiment of the present disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A display device comprising:
a display area including a plurality of pixels;
a peripheral area including a plurality of driving circuits that are arranged in a plurality of columns, the driving circuits driving the pixels;
a plurality of pads including a first pad disposed in a pad area, the plurality of pads receiving signals; and
a first signal line that extends in a column direction in the peripheral area and is connected to the first pad of the pad area,
wherein the first signal line includes a plurality of branches extending from the first signal line and connected to driving circuits of different columns, and
wherein the driving circuits of different columns output different output signals.

2. The display device of claim 1, wherein
the first signal line transmits a clock signal.

3. The display device of claim 2, wherein
the plurality of pads further include a second pad,
the display device further includes a second signal line that extends substantially parallel to the first signal line in the peripheral area and is connected to the second pad,
the second signal line includes a plurality of branches extending from the second signal line and connected to driving circuits of different columns, and
the first and second signal lines transmit a pair of clock signals.

4. The display device of claim 3, wherein
the plurality of driving circuits are arranged in a first column, a second column, and a third column,
the plurality of pads further include a third pad and a fourth pad,
the display device further includes:
a third signal line that extends in the column direction in the peripheral area and is connected to the third pad and
a fourth signal line that extends in the column direction in the peripheral area and is connected to the fourth pad,
the first and second signal lines are adjacent to the first column and include a plurality of branches that are respectively connected to driving circuits of the first column and the second column, and
the third and fourth signal lines are adjacent to the third column and include a plurality of branches that are respectively connected to a driving circuit of the third column, and transmit the pair of clock signals.

5. The display device of claim 1, wherein
the display device further includes a plurality of third signal lines that extend in the column direction and are adjacent to the driving circuits of preselected columns, the third signal lines supplying driving control signals controlling the driving circuits of the preselected columns, and
the plurality of pads further include a plurality of third pads connected to the plurality of third signal lines.

6. The display device of claim 3, wherein
the plurality of driving circuits include a plurality of first driving circuits arranged in a first column and a second column,
the plurality of first driving circuits output first output waveforms that are time-delayed from each other, and the first and second signal lines include a plurality of branches respectively connected to driving circuits of the first and second columns.

7. The display device of claim 6, wherein
the plurality of driving circuits further include a plurality of second driving circuits disposed in a third column and a fourth column,
the plurality of second driving circuits output second output waveforms that are different from the first output waveforms and are time-delayed from each other, and
the first and second signal lines include a plurality of branches respectively connected to driving circuits of the third and fourth columns.

8. The display device of claim 3, wherein
the plurality of pads further include a third pad and a fourth pad,
the display device further includes
a third signal line that extends in the column direction in the peripheral area and is connected to the third pad, and
a fourth signal line that extends in the column direction in the peripheral area and is connected to the fourth pad,
the third and fourth signal lines include a plurality of branches respectively connected to driving circuits of different columns connected to the branches of the first and second signal lines, and
the third and fourth signal lines transmit a pair of clock signals different from the pair of clock signals transmitted by the first and second signal lines.

9. The display device of claim 3, wherein
the plurality of pads further include a third pad, a fourth pad, a fifth pad, and a sixth pad,
the display device further includes
a third signal line that extends in the column direction in the peripheral area and is connected to the third pad,
a fourth signal line that extends in the column direction in the peripheral area and is connected to the fourth pad,
a fifth signal line that extends in the column direction in the peripheral area and is connected to the fifth pad, and
a sixth signal line that extends in the column direction in the peripheral area and is connected to the sixth pad,
the third and fourth signal lines include a plurality of branches respectively connected to driving circuits of at least one column,
the fifth and sixth signal lines include a plurality of branches respectively connected to driving circuits of at least one column that are not connected to the branches of the third and fourth signal lines,
the third and fourth signal lines transmit a pair of clock signals different from the pair of clock signals transmitted by the first and second signal lines, and
the fifth and sixth signal lines transmit the pair of clock signals that are transmitted by the third and fourth signal lines.

10. A display device comprising:
a display area including a plurality of pixels;
a peripheral area including a plurality of driving circuits that drive the pixels and are arranged in first, second, and third columns;
a plurality of pads including a first pad and a second pad disposed in a pad area, the plurality of pads receiving signals;
a first signal line that extends in a column direction in the peripheral area and is connected to the first pad of the pad area; and
a second signal line that extends in a column direction in the peripheral area and is connected to the second pad of the pad area,
wherein the driving circuits of the first, second, and third columns output different output signals,
the first and second signal lines transmit a pair of clock signals, and
the first and second signal lines are adjacent to the first column and include a plurality of branches extending from the first and second signal lines to the driving circuits of the first and second columns.

11. The display device of claim 10, wherein
the first and second signal lines include a plurality of branches connected to the driving circuit of the third column.

12. The display device of claim 10, wherein
the plurality of pads further include a third pad and a fourth pad,
the display device further includes:
a third signal line that extends in the column direction in the peripheral area and is connected to the third pad and
a fourth signal line that extends in the column direction in the peripheral area and is connected to the fourth pad,
the third and fourth signal lines are adjacent to the third column and include a plurality of branches that are connected to a driving circuit of the third column, and transmit the pair of clock signals.

13. The display device of claim 10, wherein
the first and second signal lines include branches that are located outside an area in which the plurality of driving circuits are arranged, the branches being connected to the driving circuit of the second column.

14. The display device of claim 10, wherein
the branches connecting the first and second signal lines to the driving circuit of the second column pass through a first column area where the driving circuits of the first column are arranged.

15. The display device of claim 10, wherein
the plurality of pads further includes a third pad and a fourth pad,
the display device further includes
a third signal line that extends in the column direction in the peripheral area and is connected to the third pad and
a fourth signal line that extends in the column direction in the peripheral area and is connected to the fourth pad,
the third and fourth signal lines include a plurality of branches respectively connected to the driving circuits of the first and second columns, and
the third and fourth signal lines transmit a pair of clock signals different from the pair of clock signals transmitted by the first and second signal lines.

16. The display device of claim 10, wherein
the display device further includes
a third signal line that extends in the column direction, is adjacent to the driving circuit of the first column, and supplies a first driving control signal that controls the driving circuit of the first column,
a fourth signal line that extends in the column direction, is adjacent to the driving circuit of the second column, and supplies a second driving control signal that controls the driving circuit of the second column, and
a fifth signal line that extends in the column direction, is adjacent to the driving circuit of the third column, and supplies a third driving control signal that controls the driving circuit of the third column, and the plurality of pads further include
a third pad connected to the third signal line,
a fourth pad connected to the fourth signal line, and
a fifth pad connected to the fifth signal line.

17. The display device of claim 16, wherein
the driving circuit of the first column outputs a signal that causes the pixel to emit light according to the first driving control signal,
the driving circuit of the second column outputs a signal that initializes the pixel according to the second driving control signal, and
the driving circuit of the third column outputs a signal that performs compensation of a transistor of the pixel according to the third driving control signal.

18. The display device of claim 17, wherein
each pixel performs the initialization, the transistor compensation, and the light emitting in sequence.

19. The display device of claim 17, wherein
the operation of each pixel is determined according to voltage levels of output signals of the driving circuits of the first to third columns.

* * * * *